United States Patent [19]

Gounder

[11] 4,394,529
[45] Jul. 19, 1983

[54] SOLAR CELL ARRAY WITH LIGHTWEIGHT SUPPORT STRUCTURE

[75] Inventor: Raj N. Gounder, Robbinsville, N.J.

[73] Assignee: RCA Corporation, New York, N.Y.

[21] Appl. No.: 290,176

[22] Filed: Aug. 5, 1981

[51] Int. Cl.$^3$ .................. H01L 31/04; B32B 27/04
[52] U.S. Cl. ..................... 136/245; 52/731;
   52/827; 52/573; 52/785; 136/292; 244/173;
   428/358; 428/408; 428/367; 428/246; 428/902
[58] Field of Search ............... 136/245, 292; 244/173;
   52/730-731, 785, 827-828, 573; 428/246, 358,
   367, 408, 902

[56] References Cited

U.S. PATENT DOCUMENTS

| | | | |
|---|---|---|---|
| 3,459,391 | 8/1969 | Haynos | 244/1 |
| 3,658,596 | 4/1972 | Osborne | 136/251 |
| 4,043,834 | 8/1977 | Rusch | 136/245 |
| 4,101,101 | 7/1978 | Barkats et al. | 244/173 |
| 4,133,501 | 1/1979 | Pentlicki | 244/173 |
| 4,209,347 | 6/1980 | Klein . | |

OTHER PUBLICATIONS

D. Rusch, "New Flexible Substrates With Anti-Charging Layers for Advanced Light-Weight Solar Array", *Proc. European Symp. On Photovoltaic Generators In Space* (ESTEC, Noordwijle, 11-13 Sept. 1978-ESA SP-140, Nov. 1978, pp. 41-48.
R. V. Elms, Jr. et al., "SEP Solar Array Technology Development", *11th Intersociety Energy Conversion Eng. Conf.* (1976), pp. 1372-1378.
"Advanced Composite Structures for Satellite Systems," R. N. Gounder, *RCA Engineer*, 26-4, Jan.-Feb. 1981, pp. 12-22.
"Design Features of the TDRSS Solar Array," Frank G. Kelly et al., *TRW Defense and Space Systems Group*, SAE/P-78/75/SO2.50, pp. 118-123.
"Advanced Lightweight Rigid Solar Arrays Based on Carbon Fibre Technology," International Astronautical Federation (IAF) XXVth Congree, Amsterdam Sept. 30, to Oct. 5, 1974, Paper 74-085, pp. 2-12.
"Optimized Design and Fabrication Processes for Advanced Composite Spacecraft Structures," V. F. Mazzio et al., *17th Aerospace Sciences Meeting*, New Orleans, LA, Jan. 15-17, 1979, pp. 1-8.
"Retrospective Search—NASA Solar Arrays," Mary Pfann, *New England Research Application Center*, University of Connecticut, pp. 1-15.
"Retrospective Search—USG/NTIS Solar Arrays," Mary Pfann, *New England Research Application Center*, University of Connecticut.
"KEVLAR . . . The Fiber that Lets You Re-Think Strength and Weight," DuPont Catalog E38532, pp. 3-4, 6, 8, 10-12, 14, 16, 18-21, and 23.

*Primary Examiner*—Aaron Weisstuch
*Attorney, Agent, or Firm*—Joseph S. Tripoli; Robert L. Troike; William Squire

[57] ABSTRACT

A panel comprising an aluminum honeycomb core and outer face skins of Kevlar, a bi-directional epoxy-reinforced polyparabenzamide fabric which is a thermal and electrical insulator adhering to the core and forming the opposite flat surfaces of the panel. Solar cells are glued directly to one face skin while a set of epoxy-reinforced carbon fiber stiffeners are glued to the other face skin. The composite structure has a coefficient of thermal expansion closely matching that of the solar cells providing a very lightweight and stiff structure.

14 Claims, 5 Drawing Figures

SOLAR CELL ARRAY WITH LIGHTWEIGHT SUPPORT STRUCTURE

The present invention relates to a support structure for electrical elements, such as an array of solar cells, which structure is especially suitable for space applications.

It is well known to support an array of solar cells on a relatively stiff panel. Cells, so mounted, are employed to provide power for a spacecraft such as a satellite.

In space applications, the panel and its cells must remain intact under a variety of conditions, some rather harsh. For example, they must withstand vibrations during launch of the spacecraft. During the launch mode large forces are exerted at low frequencies, e.g., below 50 Hz, and more particularly, in the range of about 0-30 Hz. Resonance of the panel supporting the solar array in this low frequency range is undesirable.

After launch and when orbiting, the array on its supporting panel is deployed from a folded configuration to an operating extended configuration in which the cells face the sun. Low frequency resonance, when in the operating configuration, also is undesirable. Such resonance may cause misorientation of the array relative to the sun during maneuvers of the spacecraft and this lowers the generating efficiency of the solar cells. To reduce the tendency of the panel to resonate at low frequency, it is desirable that the panel be relatively stiff.

A panel for supporting solar cells must be designed to meet certain thermal requirements. Solar cells, as they are made of semiconductor material, are relatively brittle and exhibit a relatively low coefficient of thermal expansion of about $0.5 \times 10^{-6}$ inch per inch per degree F. The supporting panel, in the usual practice, comprises an aluminum honeycomb core with an aluminum skin. Such a panel may have a coefficient of thermal expansion of about $13 \times 10^{-6}$ inch per inch per degree F. which considerably mismatches that of the solar cells. Further, the panel is electrically conductive so that the solar cells have to be electrically insulated from the panel. In practice, the cells are mounted on a dielectric interface substrate and also on a mechanical interface structure which will absorb the differences in thermal expansion of the various materials during operation. Such interfaces usually include a rubber support mount, or the like, for each solar cell.

The problems discussed above in providing a suitable panel support structure for an array of solar cells for space applications are widely recognized and there have been a number of solutions proposed, each having drawbacks. For example, in one structure, an aluminum honeycomb core is covered with an aluminum skin on upper and lower surfaces. The lower surface is stiffened with an aluminum beam stiffener having a rectangular C shape in cross-section. The other aluminum skin has mounted thereon silicone rubber mounts on which are secured the solar cells. Such structures are not completely satisfactory due to the added weight of the silicone rubber mounts. Also, to isolate the silicone rubber mounts from the aluminum skin, a plastic film sold under the registered trademark of Tedlar, is employed over the aluminum skin to which the rubber mounts are secured. All of these additional elements tend to add undesirable weight to the structure.

Other structures employ an aluminum honeycomb core on which a Tedlar film is used as a facing member over the core. Epoxy-reinforced carbon fiber stiffeners are employed to stiffen such a structure. These structures exhibit a relatively low frequency resonance of about 10 Hz, which is undesirable for most launch environments.

Other generator structures employ an epoxy-reinforced carbon fiber fabric, which is an electrical conductor stiffened on one side by stiffening beams formed of epoxy-reinforced graphite fiber fabric. A Tedlar film is bonded over the carbon fiber fabric. Silicone rubber mounts to which the solar cells are secured are on the Tedlar film. Other structures are also employed utilizing similar configurations. All of these exhibit the common drawback of undesirable added weight and relatively low resonant frequencies.

The technical literature also describes various lightweight support structures for solar arrays. In a paper entitled "Design Features of a TDRSS Solar Array," by Frank G. Kelley, Werner Lust, and Richard M. Kurland, TRW Defense and Space Systems Group, Redondo Beach, California, a panel is described which comprises an aluminum honeycomb substrate having Kapton (a registered trademark for a polymide plastic material), face-sheets with edge-rolled adhesive, and an epoxy reinforced carbon fiber supporting structure for stiffness. The solar cells with the pad contacts are used with this structure. The drawback of this system is that both the Kapton and aluminum honeycomb substrate structure have a relatively large coefficient of thermal expansion as compared to that of the solar cells, and further the resonant frequency is undesirably low.

In a report entitled "Advanced Lightweight Rigid Solar Arrays Based on Carbon Fibre Technology," paper 74-085, XXVth Congress, Amsterdam, Sept. 30 to Oct. 5, 1974, International Astronautical Federation, the overall development status and trends of solar arrays is described. This paper describes a carbon-fiber composite (CFC) structure for solar arrays. The CFC is employed as a face skin over an aluminum honeycomb core forming a sandwich structure. The disadvantage of this structure is that the CFC facing sheets are electrically conductive and require a dielectric interface with solar cells to be mounted thereon. This additional structure adds to the weight of the assembly. Another concept employs a flexible substrate mounted within a frame under pretension. The drawback of employing a flexible substrate mounted within a frame under pretension is that the flexible substrate, usually of Kapton, has a relatively large coefficient of thermal expansion and therefore tends to sag when the temperature increases and to shrink when the temperature decreases. The shrinking may distort the frame and misorient the cells as described above.

In a paper entitled "Optimized Design and Fabrication Processes for Advanced Composite Spacecraft Structures," by V. F. Mazzio and C. H. Bixler, 17th *Aerospace Science Meeting,* New Orleans, LA. Jan. 15-17, 1979, there is described composite materials employing graphite/epoxy (epoxy-reinforced carbon fiber)/epoxy and graphite/epoxy honeycomb composite structural subassemblies for employing in spacecraft structures. As stated in this paper, solar array structures require high strength to survive launch dynamic response loads when stowed, and must meet minimum stiffness requirements when deployed, in orbit. The recommended structure for composite solar array structures is described as a composite sandwich substrate panel including yoke or frame segments consisting of an open "eye" section beam and a closed box beam. The composite sandwich structure is described as an aluminum honeycomb core having 0.005 inch precured bidirectional graphite-epoxy panel faces and 0.015 precured graphite-epoxy edge members. The drawback of this system is similar to that discussed above with the other systems employing epoxy-reinforced carbon fiber face members in that they are electrically conductive.

U.S. Pat. No. 4,101,101 describes a solar generator system employing a flexible insulating support made of synthetic material, such as Kapton, for carrying solar cells on its face. The Kapton support is flexible and is secured to a frame structure. A number of stiffeners are on the structure between the frame on a side opposite the Kapton support on which the solar cells are secured. This structure has the drawback that the Kapton, as discussed above, has a relatively large coefficient of thermal expansion which may result in dislocation of the various solar cells with respect to each other. Such dislocation may result in an interconnect problem among the cells. Another drawback is that the relatively large number of stiffeners employed add to the weight of the structure. Further, the heat inputs to the cells are required to be dissipated, and also the temperature cycling of Kapton may result in the Kapton distorting the frame during contraction. In summary then, the optimum structures considered by the solar array art employ Kapton layers stiffened by epoxy-reinforced carbon fiber stiffeners in a frame structure, epoxy-reinforced carbon fiber face skins over aluminum honeycomb or over epoxy-reinforced carbon fiber honeycomb structures with additional epoxy-reinforced carbon fiber stiffening elements. These structures have drawbacks, as discussed.

In accordance with an embodiment of the present invention, a lightweight, relatively stiff supporting structure for electrical devices comprises a structural sheet member including at least one layer of epoxy-reinforced woven polyparabenzamide fabric, and a plurality of epoxy-reinforced carbon fiber stiffener elements secured to one surface of the sheet member (polyparabenzamide is available as fibers and fabric under the E. I. duPont registered trademark of Kevlar). The elements have a long axis. An array of electrical devices is secured to a surface of the layer. The stiffener elements in direction parallel to the long axis, the sheet, and the devices all have, respectively, substantially the same coefficient of thermal expansion.

Figure 1:
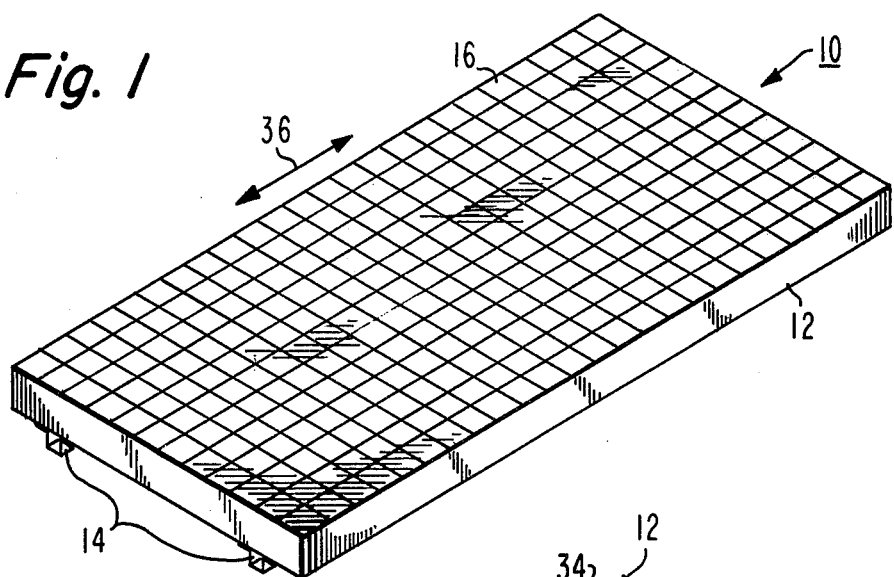
FIG. 1 is an isometric view of a panel embodying the present invention.

In FIG. 1, solar generator Panel 10 is one of an array of panels which is intended to be secured to a spacecraft such as an orbiting satellite which is launched into space. During launch the panels are stowed and when orbiting, are extended to deployed positions. The launch induces severe stress and vibrations on each of the stowed panels. It is to be understood that in the launch configuration, several launch vehicle/spacecraft system natural frequencies and hence several g-loads are exhibited in the low frequency range below 50 Hz. Therefore, the stiffness of the stowed panel 10 must be sufficiently great that its natural resonant frequency is higher than that of the system during launch so as to decouple the vibrations of the panel from the remaining spacecraft/launch vehicle system. The panels during launch are folded and tied to the spacecraft and/or the launch vehicle in a known manner.

The number and spacing of the panel tie down points are fixed for a given space craft. In this context the number and spacing of the panel tie down points represent a constraint on the panel design. That is, the launch induced large low frequency forces discussed above are transmitted to the folded panels at their tie down points in accordance with well-known principles. Thus, the stiffness of the panel relative to the number and location of the tie down points is of primary consideration in designing the panel. The discussion below and in the introductory portion with respect to resonant frequency of these panel constructions therefore must be considered relative to the location of the panel tie down points. In a particular design to be considered below, the panel 10 can withstand the launch induced stress and vibrations and has a resonant frequency greater than 50 Hz when in the stowed, tied down position at spaced tie down points as will be discussed.

Several panels may be interconnected in a given system to form an array of panels. One panel of the array is connected to the spacecraft by a boom at a boom connecting point on the panel at a location different than the tie point locations. Links which interconnect adjacent panels of the array are connected to the panels also at locations different than the tie down locations. The resonant frequency of each of the panels in the deployed condition may be different than the resonant frequency of the panels in the folded tied down position. In practice, an array of the panels 10 interconnected with a boom and panel connecting links in the deployed position exhibits a resonant frequency greater than that of any of the moving elements in the entire satellite system. After launch and during orbit, release mechanisms unfold the panels into their deployed, that is, their extended operating positions.

During their operation, the panels are exposed to solar energy having high thermal inputs. As a result, the panels are subjected to extreme thermal cycling. The panel 10 of FIG. 1, as will be described, withstands such thermal cycling while providing high strength and stiffness when in the stowed position and yet its weight is relatively low.

In FIG. 1, the panel 10 comprises a substrate structure 12, an array 14 of stiffening beams and an array of silicon solar cells 16. The array 14 of beams, shown in greater detail in FIG. 2, comprises two elongated straight beams 18 and 20 which extend from edge 22 to edge 23 of the substrate 12. Connected between the beams 18 and 20 are two parallel beams 24 and 26 interconnected by a central beam 28, the three beams 24, 26, and 28 forming an H structure, as shown. This structure has the advantage of providing stiffness to substrate 12 with relatively few beams.

Figure 5:
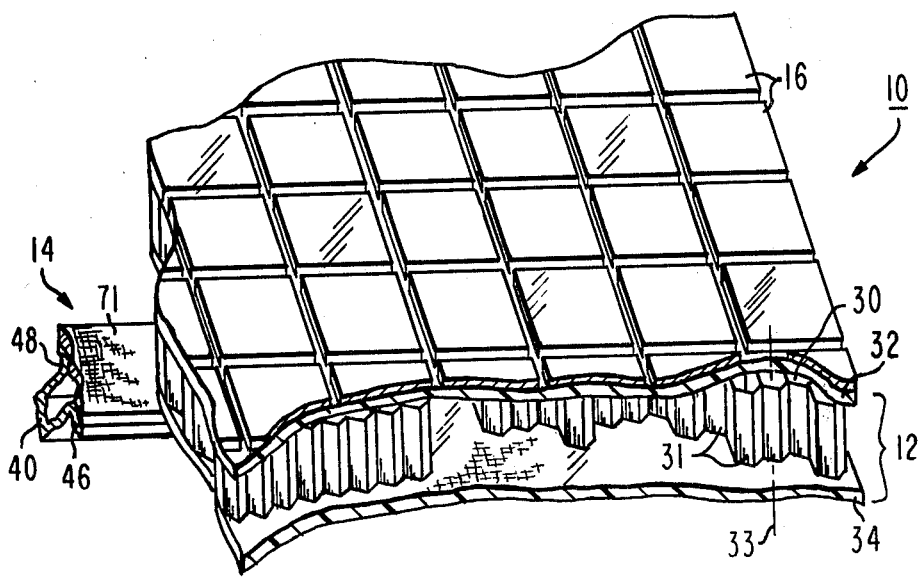
FIG. 5 is an isometric fragmented view of a portion of the structure of FIG. 1 illustrating the various substructures employed therein.

Referring to FIG. 5, the substrate 12 comprises an aluminum honeycomb core 30 which may be approximately 0.250 inches thick, over which are sheets or layers of epoxy-reinforced polyparabenzamide woven fabric, such as Kevlar, registered trademark of the E. I.

duPont Corporation. Layers 32 of Kevlar supports the solar cells and layer 34 supports the beam array 14.

The aluminum honeycomb core 30 has a very low strength and modulus in the directions normal to the cell sidewalls 31. It has a relatively high modulus in a direction parallel to axis 33, parallel to the sidewalls 31. The aluminum has a relatively high coefficient of thermal expansion and is a good thermal conductor. A layer 32 formed of bi-directional woven Kevlar fabric is secured to the upper surface of the aluminum honeycomb core 30. Layer 34 secured to the lower surface of the core 30 is also bi-directional woven Kevlar fabric. Preferably, the fabrics have a balanced plain weave such as 120 weave. This fabric is a resin or epoxy-reinforced material. The resin or epoxy initially is tacky and flexible at room temperature. When subjected to an elevated temperature, the resin or epoxy impregnated in the fabric cures and hardens. The material, when hard, is extremely stiff and of high strength. The weave of the fabric is selected to provide a coefficient of thermal expansion in the plane of the sheet material which coefficient is effectively the same as that of the solar cells 16, that is, in the neighborhood of $0.5 \times 10^{-6}$ inch per inch per degree F.

Kevlar normally exhibits a negative coefficient of thermal expansion in a direction parallel to the fiber length. That is, a particular Kevlar known as "Kevlar 49" has a coefficient of thermal expansion of $-1.1 \times 10^{-6}$ inch per inch per degree F. That means this material contracts when the temperature increases. However, the material fibers can be oriented to provide a coefficient of thermal expansion matching that of solar cells. In this respect, a 120 weave Kevlar fabric has its strands oriented orthogonal with respect to each other and exhibits a coefficient of thermal expansion of $0.4 \times 10^{-6}$ inch per inch per degree F. which is approximately the coefficient of thermal expansion of the solar cells. The above material has a specific strength (strength divided by density) of $19 \times 10^5$ inch as compared to $4 \times 10^5$ inch of aluminum 6061-T6. The Kevlar material has a specific modulus (modulus divided by density) equal to that of the above-mentioned aluminum's $100 \times 10^6$ inch. The Kevlar material is a dielectric and is thermally insulating. Impregnating the Kevlar material with a cast epoxy resin, as commercially available, results in a fabric, when cured, which forms an extremely stiff and hard skin layer. This epoxy-reinforced Kevlar fabric, being an electrical dielectric, is extremely suitable for directly mounting the solar cells 16 thereto without any interfacing structure such as Tedlar or other weight adding elements.

To bond the Kevlar layers to the honeycomb core, either one of two different procedures may be employed. In the first, the Kevlar may be co-cured, that is, it may be cured at the same time as it is being bonded to the core. The two layers 32 and 34, respectively, impregnated with epoxy, are placed over the aluminum core and cured at an elevated temperature at about 250°-350° F. with a vacuum back pressure. The structure while heated is within a non-porous pliable plastic bag. The interior of the bag is evacuated to a vacuum. The bag then compresses the elements together due to atmospheric pressure outside the bag. This procedure is known in the laminating industry as vacuum bagging. During the curing process, the layers 32 and 34 of Kevlar adhere to the honeycomb core. As surfaces of the honeycomb core are flat and as the curing takes place under pressure, the layers of Kevlar which are in intimate contact with the core surfaces, are themselves flat, when cured.

A second process comprises pre-curing the Kevlar layers to stiffen them. The layers are then glued to the aluminum honeycomb core with a 6 mil thick adhesive layer such as FM123, a tradename for an epoxy adhesive of the American Cyanamid Corporation. In either example above, the Kevlar layers are 4.5 mils single-ply thick. The disadvantage of the pre-cured procedure is that the addition of an adhesive interface for bonding the Kevlar layers to the honeycomb adds weight to the structure. For these reasons, co-curing is a preferred method.

The beam array 14 of FIG. 5 is attached to the cured Kevlar 34 after the layer is cured. Lefkoweld 109-LM52 adhesive is used to bond the beams to the Kevlar layer. The solar cells 16 are attached and positioned on the Kevlar layer 32 after curing. The beams may also be attached by co-curing with the Kevlar skins and honeycomb core. The cells being secured to the dielectric Kevlar layer are, therefore, electrically isolated from one another.

Figure 3:
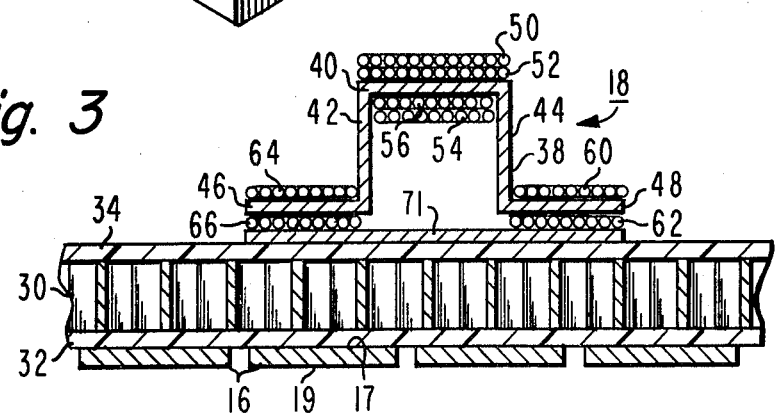
FIG. 3 is a sectional view through a portion of the panel of FIG. 2 taken along lines 3—3.

The cells 16 are electrically interconnected in a known way by interconnectors (not shown). As known, the cells 16 have electrodes on surfaces 17 and 19 (FIG. 3). The surface 17 when secured to a supporting structure, therefore, requires electrical isolation from adjacent cells. Such isolation in prior art devices has required additional electrical insulating material. In the present structure, the layer 32 being a dielectric, requires no further elements for providing electrical isolation. In addition, the integral structure employs a minimum number of materials and has an extremely high stiffness and strength for a given weight per area.

The beam array 14 is employed to provide additional stiffness to the structure, as the structure is of generally large proportions, comprising, for example, a panel 72 inches × 48 inches. More importantly, the beam array 14 maintains uniform coefficient of thermal expansion of the structure.

Figure 2:
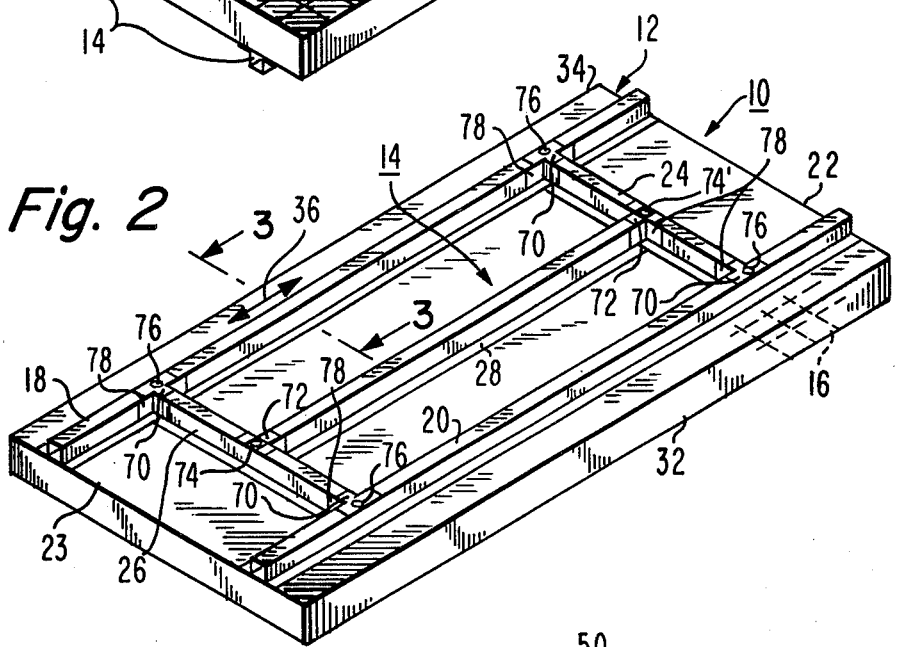
FIG. 2 is an isometric view of the underside of the panel of FIG. 1 illustrating the structural support elements.

Each of the beams of the beam array 14, as shown in FIG. 2, is identical in cross-section. Therefore, only one shown at 18 in FIGS. 3 and 4, will be described. A feature of all of the beams of FIG. 2 is that they exhibit substantially zero or slightly positive ($0.5 \times 10^{-6}$) coefficient of thermal expansion in the directions 36 of the long axis. Beam 18 is unique in that it has enhanced stiffness in the directions 36 of the long axis, while at the same time exhibiting the desired coefficient of thermal expansion. The beam 18 comprises several layers of different materials. The core material is a woven epoxy-reinforced carbon fiber 38. The threads of the core fabric 38 are oriented in two directions orthogonal to each other. The fabric 38 is shaped to form a channel having a base member 40 and two legs 42 and 44. Horizontal flanges 46 and 48 extend in opposite directions from legs 42 and 44, respectively. Fabric 38 is a resin or epoxy-reinforced material which is tacky at room temperature and which hardens into an extremely stiff, hard material when cured at an elevated temperature.

Figure 4:
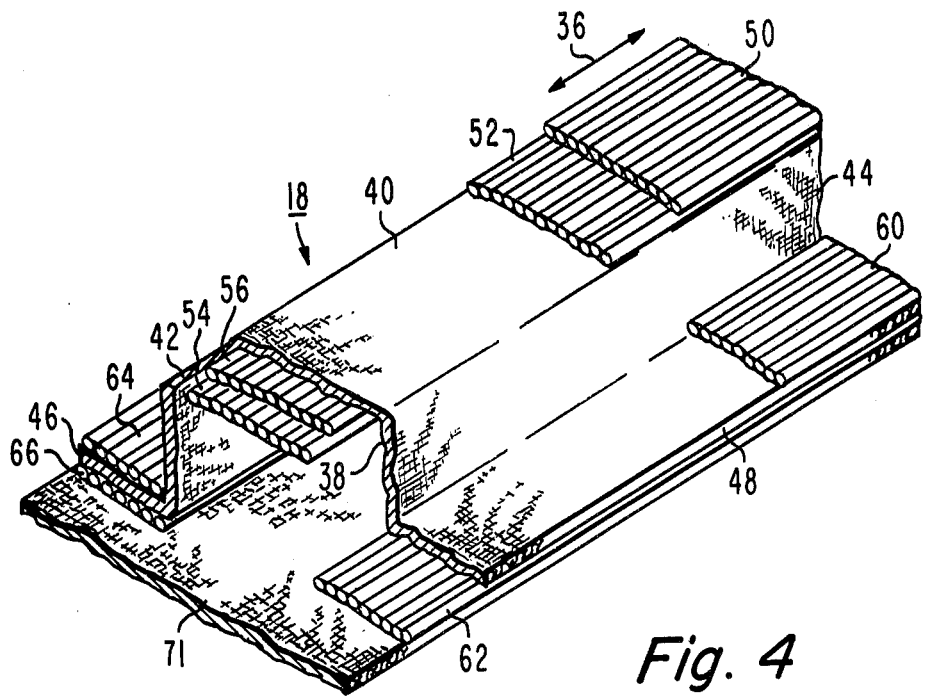
FIG. 4 is an isometric view of the stiffener beams employed in the structures of FIGS. 1, 2, and 3.

The conventional woven bi-directional epoxy-reinforced carbon fiber fabric has a slightly positive coefficient of thermal expansion, for example, in the order of $0.5 \times 10^{-6}$ inch per inch per degree F. Such fibers are manufactured by the Hercules Corporation as Magnamite AS1, a high-strength graphite; Magnamite HTS, an intermediate-strength and modulus graphite; Magnamite HMS, which is a high-modulus graphite, and Magnamite UHMS, an ultra-high modulus graphite. The Celanese Corporation manufactures a high-strength graphite as Cellion 3000, 6000, and an ultra-high modulus graphite as GY-70 and GY-70SE. The Union Carbide Corporation manufactures a high strength graphite as T300 and an ultra-high modulus graphite as P75S. The preferred carbon fiber in the construction of beam elements of FIG. 3 is either Celanese GY-70 or Union Carbide P75S. This material in its uni-directional form exhibits a specific modulus of $677 \times 10^6$ inch and a specific strength of $17 \times 10^5$ inch as compared to $100 \times 10^6$ inch and $4 \times 10^5$ inch, respectively, for aluminum 6061-T6. The bi-directional ply fibers are orthogonal to each other. The fibers of the single ply fabrics 38 and 71, FIG. 4 are oriented 0°, 90° with respect to the long axis parallel to arrows 36. That is, one set of fibers is parallel to the long axis and the other set of fibers is perpendicular to the one set. Other orientations, such as 45°, −45° (45° from the 0°, 90° orientation) are also permitted.

A coefficient of thermal expansion mismatch between solar cells and the beams of the array 14 in direction 36 would tend to distort the structure during thermal cycling. It is desirable to provide increased stiffness in the length directions 36 and a coefficient of thermal expansion close to the solar cell coefficient of thermal expansion and provide a lightweight structure.

Uni-directional epoxy-reinforced carbon fibers formed into a plurality of layers are secured to the layer 38, FIG. 3. The uni-directional epoxy-reinforced carbon fibers extend in a common parallel direction. Such fibers tend to have a slightly negative, close to zero, coefficient of thermal expansion. As provided in accordance with a feature of the present invention, two layers 50 and 52 of uni-directional carbon fiber reinforced epoxy plies are over one surface of the base 40 and two additional layers 54 and 56 of uni-directional carbon fiber reinforced epoxy plies are over the undersurface of the base 40. In one example, the beams may be formed by placing the materials at room temperature in a female mold having the desired cross-section shape. The assembly is then placed in an autoclave. The autoclave has a nitrogen atmosphere raised to 100 psi pressure at 250°-350° F. In a second example, the beam materials are pressed to 100 psi between a pair of matched dies. While pressed, the materials are cured at 250°-350° F. Layers 50, 52, 54, and 56 are single/ply tapes whose fibers extend in directions 36 parallel to the long axis of the beam. The two layers 50 and 52 on one side of the base 40 and the two layers 54 and 56 on the underside of the layer 40, tend to match each other with respect to bending moments caused by thermal cycling. That is, thermal excursions in layers 50 and 52 tend to expand or contract the layers in a way to produce forces which is counteracted by like forces created by the expansion or contraction of the layers 54 and 56 with respect to bi-directional fabric layer 38. Thus, the layers 50 and 52 on one side of the base 40 produce torques when thermally cycled which are counterbalanced by the torques produced by the layers 54 and 56 on the other side of the base 40 inducing a substantially zero net torque. Slight differences in width between layers 50, 52, 54, and 56 normal to directions 36 and parallel to base 40 in the order of a few mils has negligible effect on the counterbalanced torques. Thus, thermally caused expansions or contractions of the two sets of layers create counterbalanced torques about the base 40. Without such counterbalanced torques the beam would tend to bend or distort about its long axis in a manner similar to a bimetal element of a thermostat.

The uni-directional tapes cooperate with the bi-directional fabric 38 to produce the desired coefficient to thermal expansion. The multiple layers over and under the base 40 provide increased resistance to bending stresses induced by forces normal to the base 40 at spaced points along the length directions.

For similar reasons, mirror image uni-directional layers 60 and 62 are on upper and lower surfaces of the flange 48 and like layers 64 and 66 are on the upper and lower surfaces of the flange 46 of beam 18. Each of the layers 60, 62, 64, and 66 comprises a single-ply uni-directional epoxy-reinforced carbon fiber tape. The fibers of layers 60-64 all extend in a direction parallel to those of layers 50-54. Layers 60-64 on the upper surface of the corresponding flanges counteract thermally induced stresses in the lower layers 62 and 66, respectively. Thus, the uni-directional fibers provide increased strength of the beam with respect to bending couples induced by forces normal to the plane of base 40, such as forces at the ends 22 and 23. The beams, FIG. 2, exhibit a coefficient of thermal expansion closely matching that of the solar cells and of the Kevlar-aluminum honeycomb core structure. The transverse dimension of beam 18, that is, the dimension perpendicular to the directions 36 of the beam 18 in the plane of base 40, may exhibit a coefficient of thermal expansion different than that desired. However, due to the fibers of layers 50, 52, 54, and 56 extending in the long direction 36, the beam is relatively weaker in its resistance to bending couples in this transverse direction and the expansion of the beam in that transverse direction has a negligible effect on the overall composite structure responsive to temperature excursions. The aluminum honeycomb core 30, while exhibiting a relatively high coefficient of thermal expansion and also being a relatively low strength modulus structure in the direction of its plane such as direction 36, as described above, is prevented from expanding in the presence of thermal temperature excursions by the structural rigidity of the Kevlar layers 34 and 32. The strength of layers 32 and 34 is significantly greater than the strength of the aluminum core in the horizontal direction, FIG. 3. Thus the layers 32 and 34 are principally responsive to temperature and tend to override the effect of thermal variations in dimension of the core 30, especially in view of the core 30 low modulus in directions 36.

To complete the beam structure, FIG. 4, an epoxy-reinforced woven bi-directional carbon layer 71 is secured to the flanges 46 and 48 over the lower layers 62 and 66 of uni-directional fibers. The fibers of layer 71 extend in the same directions as the fibers of layer 38, i.e., parallel and normal to directions 36. After curing the beam 18, the beam is attached to the layer 34, FIG. 3, during curing or after curing of the layers 32 and 34 with the honeycomb core 30 to form a composite structure. The graphite bi-directional fabric may be 135 weave.

It is to be understood that a fewer or greater number of layers such as layers 50-54, 60-66 in the beams may be provided in accordance with a given spacecraft structure. The magnitude of the bending moments about a transverse axis through the base 40 and flanges 46 and 48 may be different for different spacecraft structures. The number of layers 50-54, 60-66 is determined by the magnitude of such bending moments.

A boom connecting link 74 (FIG. 2) is located in beam 26 centrally between beams 18 and 20. This link receives a panel deploying boom (not shown) which secures the panels to the spacecraft (not shown). A second link 74' is located in beam 24 centrally between beams 18 and 20 for receiving a panel interconnect link (not shown) which connects a second panel to panel 10 in the stowed and deployed orientations. Threaded metal inserts 76 in beams 18 and 20 receive panel hold down elements, e.g., bolts, to secure the panels to the spacecraft during launch. The links 74, 74' and inserts 76 being metal, need to be electrically isolated from the beams which are carbon (graphite) to prevent galvanic corrosion. For this reason, the inserts 76 and links 74, 74' are secured in dielectric Kevlar adapters (not shown) secured to the beams at the positions of the links and inserts.

As explained previously, the inserts 76 are fixed in a given spaced relationship for a given spacecraft. Therefore, the stiffness of the panel 10 is measured with respect to the locations of inserts 76. The resonant frequency of panel 10 is above 50 Hz when the panel is secured at inserts 76 to a spacecraft. These inserts are positioned symmetrically to the panel 10, and more specifically, symetrically with respect to the beams 18 and 20 and adjacent to the connections to beams 24 and 26. By way of example, for a panel having the dimensions given herein, the inserts 76 are spaced 48 inches apart center-to-center in the directions 36 and are spaced 38 inches apart, center-to-center in a direction normal to directions 36. The link 74 and link 74' to which the booms (not shown) are secured are each at the midpoints of beams 26 and 24 respectively.

The location of the tie down points is a factor in determining the layout of the beams 18, 20, 24, 26, and 28. Also, the shape and size of the panel are factors to consider in determining the beam layout. The layout of the beams, as shown herein, is an "H" shape, but other shapes may also be employed depending on the above factors. For example, the beam array can be rectangular, square, star, a grid network, or other configurations. While the panel is shown as rectangular, it too can have many different shapes.

The tie down inserts 76 are preferably threaded through holes which are bolted to the spacecraft. The inserts 76 of adjacent stowed panels are aligned and bolted together. Other suitable devices may be employed in the alternative for receiving ropes or other types of tie down mechanisms.

The entire structure of FIGS. 1 and 2 is extremely stiff, has a natural resonant frequency greater than 50 Hz when tied to the spacecraft in the launch configuration, is lightweight uses relatively few materials, requires no additional adhesives to bond the various elements in some implementations, requires no dielectric interface between the facing layer 32 and the solar cells 16 unlike prior art systems employing aluminum cores and electrically conductive skins, and provides good thermal match between all of the structural elements. The aluminum honeycomb core in combination with the Kevlar layers 32, 34 and beam array 14 has a unique thermal property. The aluminum, being a good thermal conductor, conducts heat from thermally insulating layer 32 facing the sun to thermally insulating layer 34 facing dark space. Kevlar, being a good thermal radiator, having high emissivity, radiates the conducted heat to dark space. Thus, the aluminum core, Kevlar skin combination tends to equalize the temperature of the structure more effectively than prior art structures.

While co-curing has been described as a preferable method for assembling the elements, it will occur to those of ordinary skill that pre-curing the various Kevlar layers and then attaching them may also be desirable in some implementations. It is to be understood; however, that these implementations require the addition of separate adhesives for the various elements, including the beams, layers 32, 34, and the aluminum 30.

The Kevlar fibers of layers 32 and 34 are oriented 0°, 90° with one set of fibers parallel to directions 36, FIG. 4, which is also the same direction as the length dimension of the substrate 12, FIG. 1. The other fibers are normal to this direction, and extend in a direction across the width dimension of the substrate. That is, the Kevlar fibers are parallel to the cell grid structure as shown in FIG. 1. The Kevlar fibers are strongest in a direction parallel to their length. The maximum stiffness is desired in the length dimension, directions 36 of beams 18 and 20, FIG. 2 i.e., resistance to bending couples about a transverse axis. Thus, one set of Kevlar fibers is parallel to this direction to provide maximum stiffness to the structure with respect to torques about axes normal to directions 36.

In FIG. 2, gussets 70 of single-ply 4.5 mil thick epoxy-reinforced woven bi-directional polyparabezamide fabric are on top of the connecting joints of beams 18, 20, 24, and 26. Gussets 72 are on top of the connecting joints of beams 28 with beams 24 and 26. The gussets 70 and 72 are secured in place to the beams 24, 26, and 28 by bonding.

L-shaped doublers 78, only some of which are shown, are also employed in the structure at the corners of all of the beam joints. The doublers are single or multiple plies of epoxy-reinforced bi-directional carbon fiber fabric used to reinforce the beams at their joints. The relatively small amount of material employed has a negligible effect on the overall beam system coefficient of thermal expansion.

What is claimed is:

1. A structure comprising:
    an aluminum honeycomb core member having first and second surfaces,
    at least one ply of an epoxy-reinforced polyparabenzamide fabric sheet adhering to each said surfaces,
    a plurality of electrical devices having a given coefficient of thermal expansion adherently secured to the outer surface of one of said fabric epoxy sheets; and
    a plurality of epoxy-reinforced carbon fiber stiffener elements, each having a long axis and a transverse axis, said stiffener elements adhering to the exposed surface of the other of said fabric-epoxy sheets, said fabric epoxy sheets, electrical devices, and stiffener elements all having substantially the same effective coefficient of thermal expansion in a given direction parallel to the surfaces of said fabric epoxy sheets.

2. The structure of claim 1 wherein said stiffener elements each comprise a core layer of epoxy-reinforced carbon fibers woven in orthogonal directions formed into a channel extending in a direction parallel to said long axis and first and second flanges extending in a direction normal to said long axis from the extended edges of corresponding first and second legs of said channel, said elements further including at least one ply of epoxy-reinforced uni-directional carbon fibers whose fibers extend only in a direction parallel to said long axis, said latter at least one ply being attached to said flanges and the base region of said channel on both sides of said base region and on both sides of each of said flanges.

3. The structure of claim 1 wherein said stiffener elements include two parallel straight channel members extending edge-to-opposite-edge of said fabric-epoxy sheet and a group of straight channel members connected to and between said parallel members in a generally "H-shaped" array.

4. The structure of claim 3 wherein said stiffener elements are connected at spaced joints further including a plurality of polyparabenzamide fabric-epoxy reinforced gusset members over said elements at said spaced joints.

5. A solar generator comprising:
a composite structural sheet member including at least one layer of epoxy-reinforced polyparabenzamide woven fabric,
a plurality of epoxy-reinforced carbon fiber stiffener elements secured to one side of said sheet member, said elements having a long axis, and
an array of solar cells secured to a surface of said layer, wherein said stiffener elements in a direction parallel to said long axis, said sheet, and said solar cells all have effectively the same coefficient of thermal expansion.

6. The generator of claim 5 wherein said stiffener elements each comprise a channel member having a channel base member and a pair of channel legs extending from the base member and a pair of flanges extending from the extended leg edges, the channel base member comprising woven epoxy-reinforced carbon fibers in which the fibers are oriented in orthogonal directions, and at least one layer of epoxy-reinforced uni-directional carbon fibers on each side of said base and on each side of said flanges.

7. In a panel including a core member and an array of electrical devices on one side thereof, each said device having an electrically conductive surface, in contact with said one side, the improvement comprising:
a plurality of stiffener elements each having a long axis and a transverse axis, said elements being secured to the other side of said core member;
each element comprising a layer of epoxy-reinforced woven carbon fibers which extend in a plurality of different weave directions and formed into a channel member, said channel member having a base member and first and second legs extending from the base member, said base member and legs extending in a direction parallel to said long axis, a first flange extending from the extended edge of one leg in one transverse direction and a second flange extending from the extended edge of the other leg in a second transverse direction, a plurality of layers of epoxy-reinforced carbon uni-directional fibers extending in a direction parallel to said long axis secured to said layer of woven carbon fibers, said carbon fibers having a composite coefficient of thermal expansion about the same as the devices in said array in said long direction, at least two of said layers of uni-directional fibers being on one side of said base member and a like number of layers of uni-directional fibers being secured on the other side of said base member, at least one layer of uni-directional epoxy-reinforced carbon fibers on each side of said flanges, the uni-directional fibers on said flanges and said base region all extending in the same direction parallel to said long axis, said stiffener elements each having a coefficient of thermal expansion in said direction parallel to said long axis substantially the same as that of the devices of said array.

8. The panel of claim 7 wherein said core member comprises at least one layer of an epoxy-reinforced woven polyparabenzamide fabric having a coefficient of thermal expansion about the same as said devices.

9. The panel of claim 7 wherein said elements further include an epoxy-reinforced woven carbon fiber layer secured to a side of each of the uni-directional fibers on one side of said flanges to form an enclosed tube with said base member and said legs.

10. A solar generator structure comprising:
an array of solar cells, each cell having about the same coefficient of thermal expansion; and
a solar cell array support structure having a resonant frequency of at least 50 hertz when connected at certain spaced locations, comprising an aluminum honeycomb core and first and second dielectric sheets on respective first and second sides of said core and a plurality of epoxy-reinforced carbon fiber beams secured to one of said sheets, said beams having a long axis, said beams in a direction parallel to said long axis and said core-sheet structure all having a coefficient of thermal expansion of about the same value as that of the cells of said array, said sheets comprising woven epoxy-reinforced polyparabenzamide fibers.

11. The generator of claim 10 wherein said beams comprise a single layer of omni-directional epoxy-reinforced carbon fibers formed into a given shape and multiple layers of uni-directional epoxy-reinforced carbon fibers whose directionality is parallel to said long axis, a given number of uni-directional layers on one side of a portion of said omni-directional fibers being matched by a like number of uni-directional layers on the other side of said omni-directional fibers and extending in a direction parallel to said long axis from end to end of each said beam.

12. A stiffening beam comprising:
an elongated element of generally U-shaped cross-section with two flanges, both lying in the same plane, extending in opposite directions from the ends of the U, the element being formed of a first carbon fiber fabric impregnated with epoxy and cured;
and at least two tapes, one on each surface of the base of the U, formed of uni-directional carbon fibers which extend parallel to the length dimension of the beam, each tape comprising an epoxy impregnated second carbon fiber fabric, the two tapes adhering to opposite surfaces of the base of the U.

13. The beam of claim 12 wherein the fibers of the first fabric are orthogonal to each other and approximately 45° to the fibers of the tapes.

14. The beam of claim 12 further including at least one tape adhering to each surface of each flange and formed of uni-directional carbon fibers which extend parallel to the length dimension of the beams, the latter tape comprising an epoxy impregnated carbon fiber fabric.

* * * * *